United States Patent
Kimura et al.

(10) Patent No.: US 6,563,216 B1
(45) Date of Patent: May 13, 2003

(54) SEMICONDUCTOR DEVICE HAVING A BUMP ELECTRODE

(75) Inventors: Noriyuki Kimura, Chiba (JP); Kiyoaki Kadoi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/632,324

(22) Filed: Aug. 4, 2000

(30) Foreign Application Priority Data

Aug. 5, 1999 (JP) ............................................. 11-222847

(51) Int. Cl.[7] .......................... H01L 23/48; H01L 29/40
(52) U.S. Cl. ...................... 257/737; 257/738; 257/758
(58) Field of Search ................................ 257/737–738, 257/779, 780, 786, 787, 741, 751, 758–760, 765, 771, 774, 781–784, 792, 796, 739, 754, 775, 773, 776; 438/460, 462, 597, 612–618, 613–617; 228/180.22

(56) References Cited

U.S. PATENT DOCUMENTS

| | | | | |
|---|---|---|---|---|
| 5,220,199 A | * | 6/1993 | Owada et al. ............... 257/773 |
| 5,229,645 A | * | 7/1993 | Nakashima ................. 257/773 |
| 5,648,686 A | * | 7/1997 | Hirano et al. ............... 257/778 |
| 5,686,762 A | * | 11/1997 | Langley ...................... 257/775 |
| 6,022,792 A | * | 2/2000 | Ishii et al. ................... 438/462 |
| 6,288,414 B1 | * | 9/2001 | Ahn ............................ 257/72 |
| 6,444,484 B1 | * | 9/2002 | Ahn ............................ 438/30 |

FOREIGN PATENT DOCUMENTS

| | | | | |
|---|---|---|---|---|
| JP | 401128546 A | * | 5/1989 | ................. 257/737 |
| JP | 403242938 A | * | 2/1990 | ................. 257/737 |

* cited by examiner

*Primary Examiner*—Tom Thomas
*Assistant Examiner*—Douglas W. Owens
(74) *Attorney, Agent, or Firm*—Adams & Wilks

(57) ABSTRACT

In a semiconductor device, a metal wiring film and a lower-layer film under a bump electrode are patterned to form irregular steps under the bump electrode. With the formation of the irregular steps, the contact area of the bump electrode with a semiconductor substrate is increased to improve the mechanical strength. The lower-layer film is formed of a polysilicon film, an insulating film or a protective film such as a silicon nitride film, or Al—Si—Cu, Al—Si, Al—Cu or Cu. A portion where irregular steps are formed is in a region under the bump except for a protective film opening portion.

16 Claims, 4 Drawing Sheets

SEMICONDUCTOR DEVICE HAVING A BUMP ELECTRODE

BACKGROUND OF THE INVENTION

1. Field of the Invention

The present invention relates to the structure of a semiconductor device which improves a mechanical strength between a bump electrode formed on the semiconductor device and a semiconductor device substrate.

2. Description of the Related Art

Up to now, in mounting of a semiconductor device, packaging means has frequently been employed. However, with an increase in need for downsizing an electronic device and making it light-weight, a portable electronic device such as a portable telephone or a digital camera is required to realize higher-density mounting. At present, a small-sized package such as BGA or CSP has been applied, and further a flip chip mounting where a mounted circuit substrate or the like and a bump electrode are connected directly to each other in a bear chip state is utilized as means for realizing the high-density mounting.

The flip chip mounting is conducted by a method of connecting a bump electrode 1 on a semiconductor device shown in FIG. 5 directly to a mounting circuit substrate or the like. A bump electrode used for connection is formed by the following procedures 1 to 5.

1. An insulating film 7 is deposited on a semiconductor substrate 8.

2. A metal wiring 4 made of Al or the like is patterned on the insulating film 7 as a connecting or wiring layer.

3. The metal wiring 4 is coated with a protective film 3 made of silicon nitride or the like so that an opening is formed only at a portion where an electrode is to be formed.

4. A barrier metal 2 made of Cr or the like is deposited by sputtering.

5. A bump electrode 1 made of solder or the like is formed by an electrolytic plating method.

In general, the semiconductor devices fabricated by the above-described manner have been widely employed in flip chip mounting.

However, in order to realize higher-density mounting, the above semiconductor device is required to reduce an electrode area and a bump diameter. However, if the electrode area and the bump diameter are reduced, a contact area of the bump electrode with the semiconductor device substrate is reduced, resulting in such a problem that the mechanical strength of the bump electrode is insufficient.

SUMMARY OF THE INVENTION

The present invention has been made to solve the above problem, and therefore an object of the present invention is to provide a semiconductor device which improves the mechanical strength of a bump electrode and a semiconductor device substrate, thereby being capable of achieving higher-density mounting.

In order to achieve the above object, according to the present invention, there is provided a semiconductor device characterized in that an irregularly stepped pattern is formed on a wiring layer, an insulating film, a protective film, etc., in a region under the bump electrode except for a protective-film opening portion.

The irregularly stepped pattern is an asperity under the bump electrode or a plurality of salient on insulation layer.

BRIEF DESCRIPTION OF THE DRAWINGS

These and other objects, features and advantages of this invention will become more fully apparent from the following detailed description taken in conjunction with the accompanying drawings in which.

DETAILED DESCRIPTION OF THE PREFERRED EMBODIMENTS

Now, a description will be given in m ore detail of preferred embodiments of the present invent ion with reference to the accompanying drawings.

Figure 1:
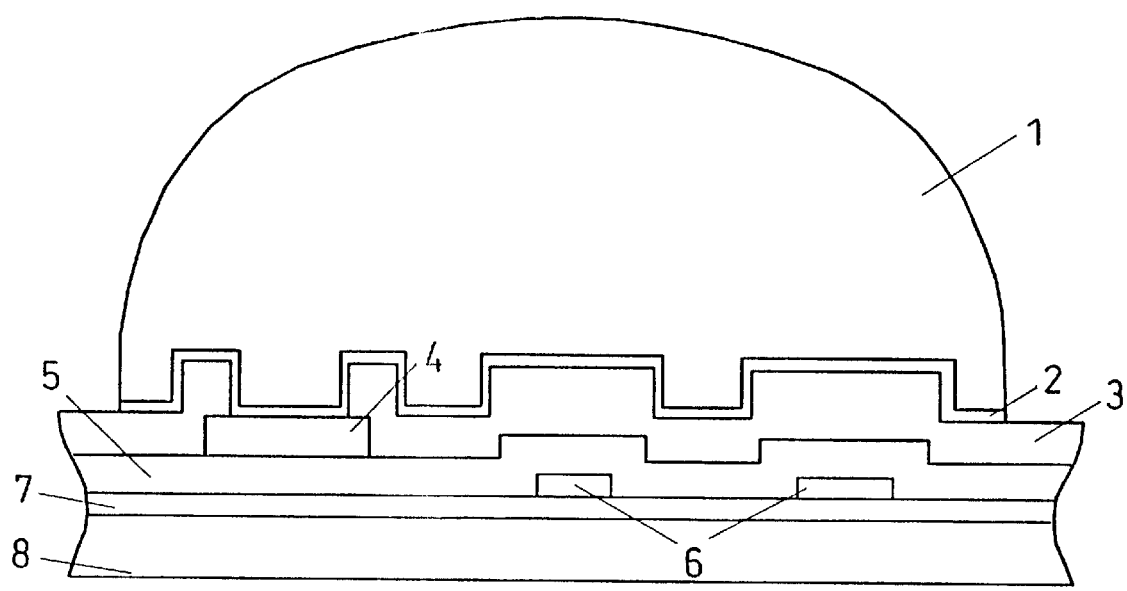
FIG. 1 is a cross-sectional view showing a semiconductor device in accordance with a first embodiment of the present invention.

A first embodiment of the present invention will be described with reference to FIG. 1. FIG. 1 is a cross-sectional view showing a portion of a semiconductor device having a bump electrode which is in the vicinity of a bump. The semiconductor device according to the first embodiment is formed by the following procedures 1 to 6.

1) An insulating film 7 is deposited on a semiconductor substrate 8.

2) A layer 6 made of polysilicon or the like is patterned on a lower layer of a bump electrode 1 in the form of a lattice. The patterned layer 6 may alternatively be made one or more layers selected from Al—Si—Cu, Al—Si, Al—Cu, Cu, a silicon nitride film, a silicon oxide film and a polyimide film.

3) After an interlayer insulating film 5 has been deposited on the patterned surface, a metal film made of Al or the like is deposited on the inter-layer insulating film 5 as a wiring layer by sputtering or the like to cover the film 5, and patterned into a metal wiring 4 with a desired shape.

Figure 6:
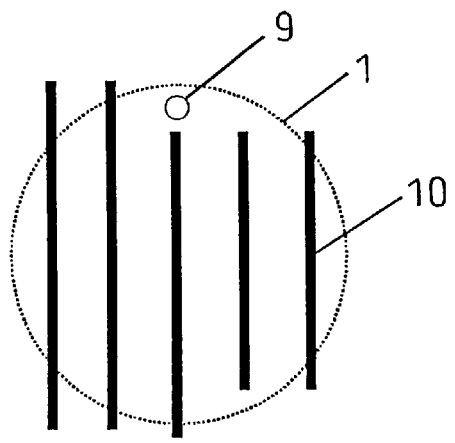
FIG. 6 is a schematic diagram showing an example arrangement of irregular steps formed in a region under a bump electrode except for a protective film opening portion.
Figure 7:
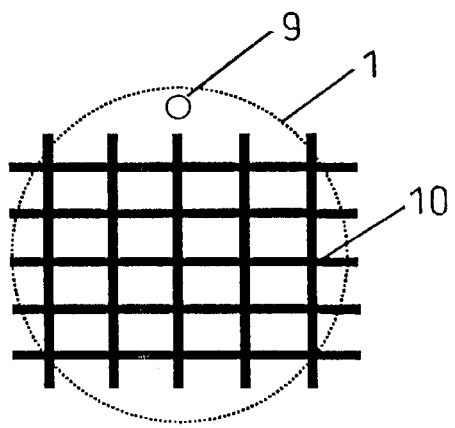
FIG. 7 is a schematic diagram showing another example arrangement of irregular steps formed in a region under the bump electrode except for the protective film opening portion.

4) The metal wiring 4 is coated with a protective film 3 made of silicon nitride or the like so that an opening 9 (see FIGS. 6–8) is formed only at a portion where an electrode is to be formed.

5) A barrier metal 2 made of Cr or the like is deposited between the bump electrode 1 and the protective film 3 through sputtering or vacuum deposition.

Figure 8:
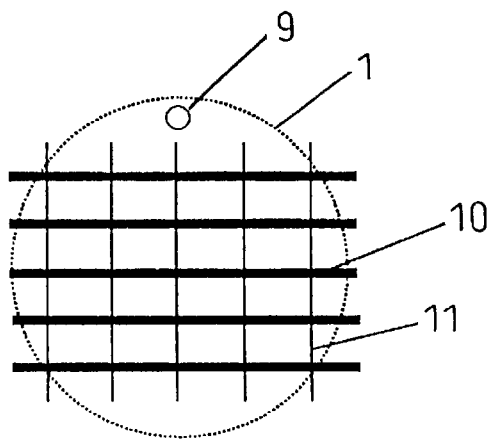
FIG. 8 is a schematic diagram showing still another example arrangement of irregular steps formed in a region under the bump electrode except for the protective film opening portion.

6) The bump electrode 1 is formed in the shape of a ball, a column, or the like. Also, the arrangement of irregular steps 10 of the electrode layer film is formed in a parallel pattern shown in FIG. 6, in a lattice-like pattern shown in FIG. 7 or in a pattern of irregular steps 10 and 11 formed of multiple layers arranged orthogonally to one another, which is shown in FIG. 8. Thus, the contact area of the bump electrode with the semiconductor substrate is effectively increased. With the above manner, the irregular steps are formed in a region under the bump electrode except for the protective-film opening portion, thereby making it possible to manufacture a semiconductor device which has an increased contact area between the bump electrode and the semiconductor device substrate and which is high in mechanical strength.

Figure 2:
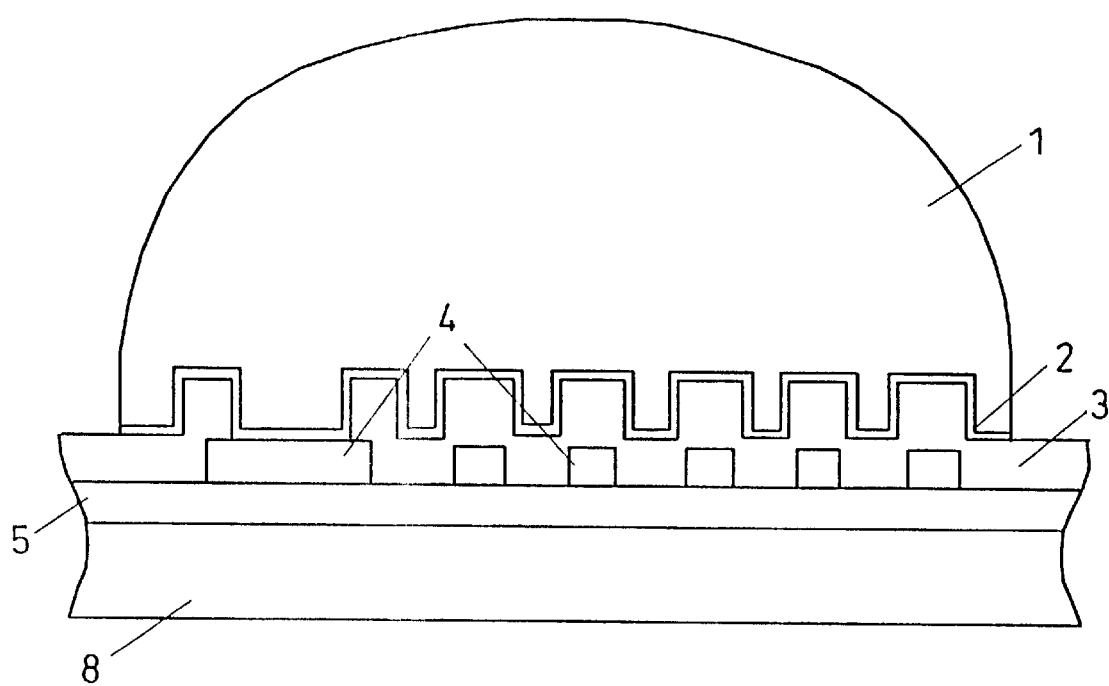
FIG. 2 is a cross-sectional view showing a semiconductor device in accordance with a second embodiment of the present invention.

Subsequently, a second embodiment of the present invention will be described hereinafter. FIG. 2 is a cross-sectional view showing a portion of a semiconductor device in the vicinity of a bump. A metal wiring 4 is employed as a layer that forms irregular steps as shown in FIG. 2, which brings about the same effect as that in the first embodiment. In the second embodiment, the metal wiring 4 is selected as the layer that forms the irregular steps. However, the same effect can be obtained also when a protective film, a silicon nitride film, an insulating film or the like is employed as the irregularly stepped layer.

Figure 3:
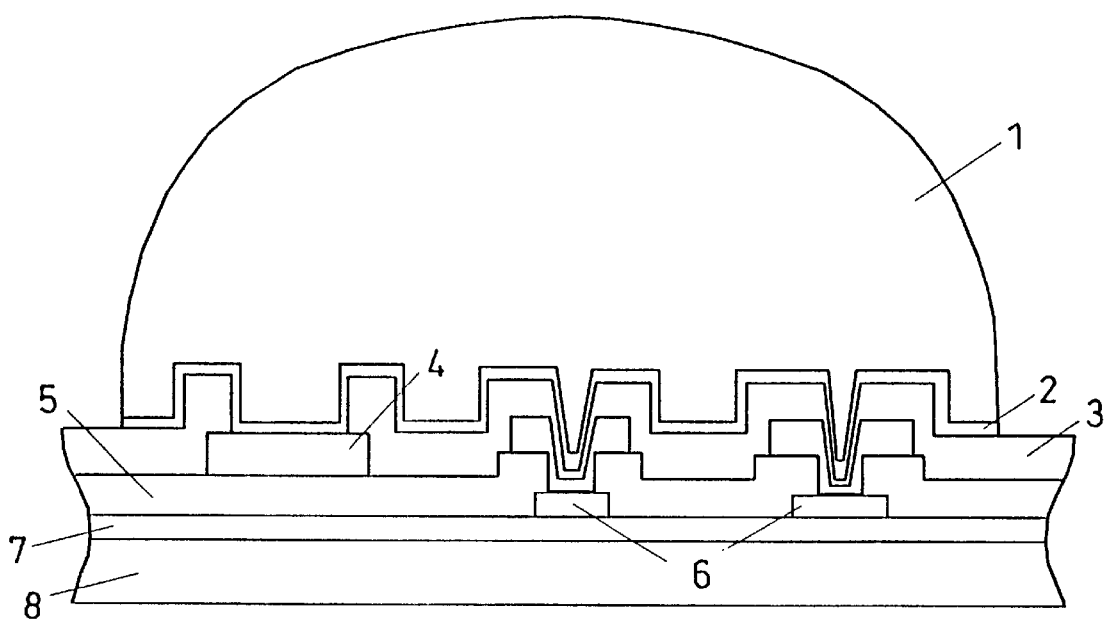
FIG. 3 is a cross-sectional view showing a semiconductor device in accordance with a third embodiment of the present invention.

Subsequently, a third embodiment according to the present invention will be described hereinafter. FIG. 3 is a cross-sectional view showing a semiconductor device in the vicinity of a bump. The semiconductor device according to the third embodiment is formed by the following procedures 1 to 6.

1) An insulating film 7 is deposited on a semiconductor substrate 8.

2) A layer 6 made of polysilicon or the like is patterned on a lower layer of a bump electrode 1 in the form of a lattice.

3) After an interlayer insulating film 5 has been deposited on the patterned surface, contact holes are formed on the polysilicon layer 6. Then, a metal film made of Al or the like is deposited on the contact holes as a wiring layer by sputtering or the like to cover the holes, and patterned into a metal wiring 4 with a desired shape.

4) The metal wiring 4 is coated with a protective film 3 made of silicon nitride or the like so that an opening is formed only at a portion where an electrode is to be formed.

5) A barrier metal 2 made of Cr or the like is deposited between the bump electrode 1 and the protective film 3 through sputtering or evaporation method.

6) The bump electrode 1 is formed from solder, gold or the like on the barrier metal 2 by electroplating.

Figure 4:
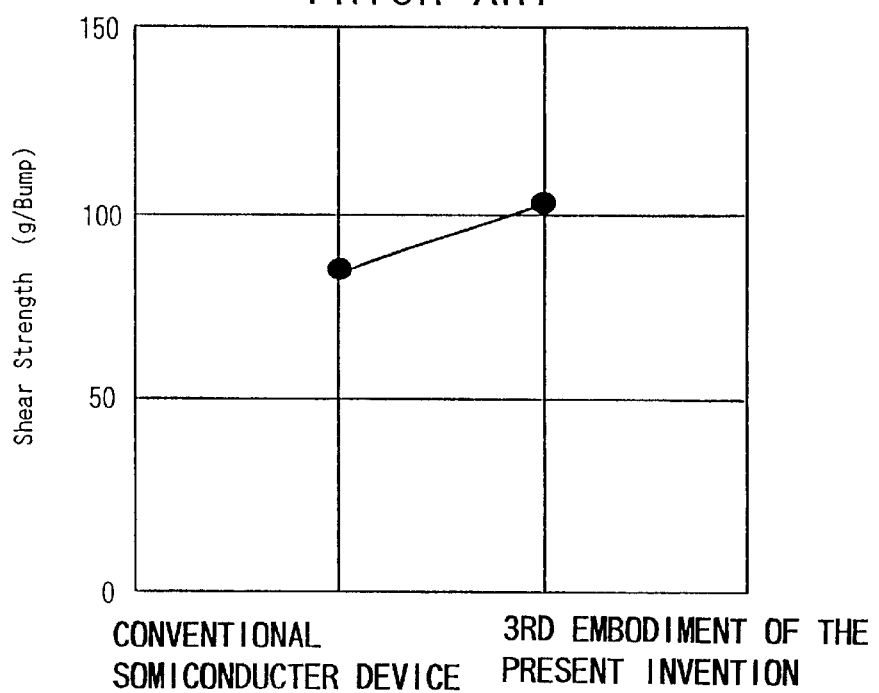
FIG. 4 is an explanatory diagram in which a comparison is made on the strength of bump electrode of a conventional semiconductor device to that of the semiconductor device according to the third embodiment of the present invention.
Figure 5:
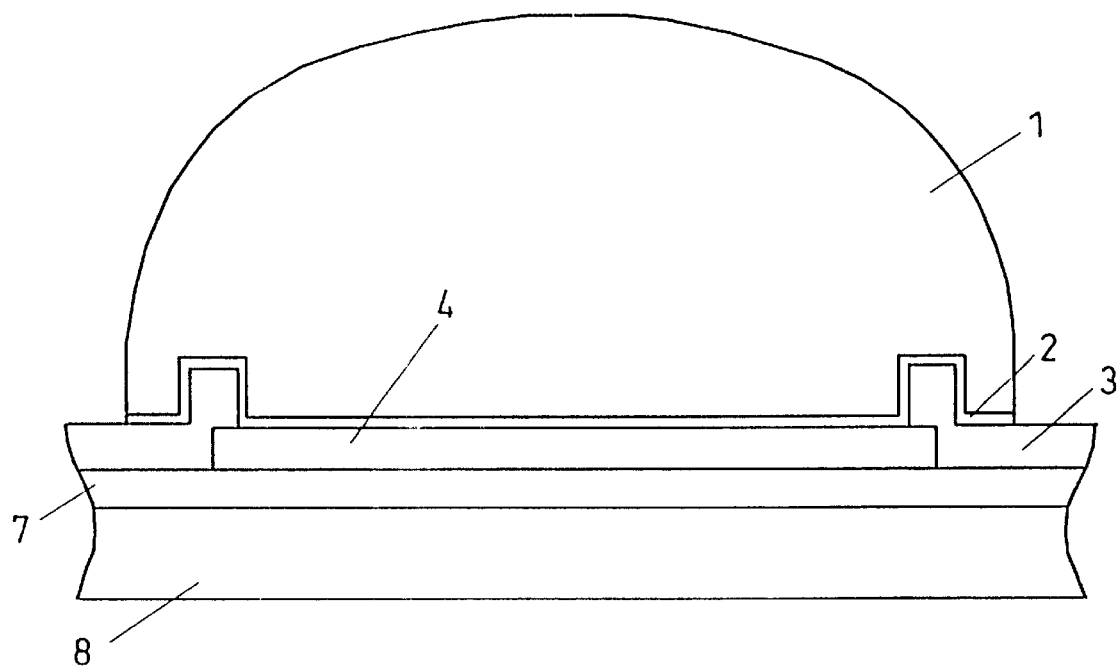
FIG. 5 is a cross-sectional view showing a semiconductor device having a conventional bump electrode.

With the above manner, irregular steps formed of the polysilicon layer 6 and irregular steps formed of the contact holes are combined together, thereby making it possible to manufacture a semiconductor device which has an increased contact area between the bump electrode and the semiconductor device substrate and which is high in mechanical strength. FIG. 4 is a graph showing the comparison of the strength of the conventional bump electrode with the strength of the bump electrode of the semiconductor device described in the third embodiment. In the experiment, a semiconductor device having a bump electrode which is 110 μm in diameter is used for both of the conventional example and the third embodiment. As shown in FIG. 4, the semiconductor device according to the third embodiment of the present invention is improved more than the conventional semiconductor device in the strength of the bump electrode by 15% or more.

As has been described above, in the semiconductor device according to the present invention, the irregular pattern is formed in a region under the bump electrode except for the protective-film opening portion, so that the contact area of the bump electrode with the semiconductor device substrate can be increased, and the mechanical strength of the bump electrode can be enhanced. Accordingly, the electrode area and the bump diameter can be reduced as compared with conventional semiconductor devices, and the higher-density mounting can be also achieved.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device comprising: a semiconductor substrate; an insulation film formed on the semiconductor substrate; a patterned film formed on a portion of the insulation film; an interlayer insulation film formed on the insulation film and the patterned film and having a first stepped surface portion over the patterned film and a first contact hole in the first stepped surface portion; metal wiring formed over the first stepped surface portion of the interlayer insulation film and in the first contact hole; a protective film formed on the first stepped surface portion of the interlayer insulation film and the metal wiring and having a second stepped surface portion and a second contact hole; a barrier metal film formed on the protective film and having a third stepped surface portion disposed above and formed by the first and second stepped surface portions and the first and second contact holes; and a bump electrode formed on the third stepped surface portion of the barrier metal film.

2. A semiconductor device according to claim 1; wherein the patterned film is formed of one or more layers selected from the group consisting of polysilicon, Al—Si—Cu, Al—Si, Al—Cu, Cu, a silicon nitride film, a silicon oxide film and a polyimide film.

3. A semiconductor device according to claim 1; wherein the patterned film comprises a plurality of parallel stripes.

4. A semiconductor device according to claim 1; wherein the patterned film is arranged in the form of a lattice.

5. A semiconductor device according to claim 1; wherein the patterned film is formed of two or more layers having patterns arranged orthogonally to one another.

6. A semiconductor device according to claim 1; wherein the patterned film is a polysilicon film.

7. A semiconductor device according to claim 1; wherein the first stepped surface portion is formed directly under the second and third stepped surface portions.

8. A semiconductor device according to claim 7; wherein the firsthand second contact holes are in alignment with each other.

9. A semiconductor device according to claim 1; wherein the first and second contact holes are in alignment with each other.

10. A semiconductor device comprising: a substrate; a patterned film formed on the substrate to provide a first stepped surface portion; an insulation film formed over the patterned film to have a second stepped surface portion over the first stepped surface portion and a first contact hole in the second stepped surface portion; a wiring layer formed on the second stepped surface portion to coat the first contact hole; a protective film formed on the wiring layer and having a third stepped surface portion over the first and second stepped surface portions and a second contact hole formed in the third stepped surface portion; a barrier metal film formed on the protective film and having a fourth stepped surface portion disposed over and formed by the first through third stepped surface portions and the first and second contact holes; and a bump electrode formed on the fourth stepped surface portion.

11. A semiconductor device according to claim 10; wherein the first and second contact holes are in alignment with each other.

12. A semiconductor device according to claim 10; wherein the patterned film is a polysilicon film.

13. A semiconductor device according to claim 10; wherein the patterned film is formed of one or more layers selected from the group consisting of polysilicon, Al—Si—Cu, Al—Si, Al—Cu, Cu, a silicon nitride film, a silicon oxide film and a polyimide film.

14. A semiconductor device according to claim 10; wherein the patterned film comprises a plurality of parallel stripes.

15. A semiconductor device according to claim 10; wherein the patterned film is arranged in the form of a lattice.

16. A semiconductor device according to claim 10; wherein the patterned film is formed of two or more layers having patterns arranged orthogonally to one another.

* * * * *